United States Patent
Stella et al.

(10) Patent No.: US 9,105,598 B2
(45) Date of Patent: Aug. 11, 2015

(54) PACKAGE/HEATSINK SYSTEM FOR ELECTRONIC DEVICE

(75) Inventors: Cristiano Gianluca Stella, San Gregorio di Catania (IT); Concetto Privitera, Gravina di Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 518 days.

(21) Appl. No.: 13/537,166

(22) Filed: Jun. 29, 2012

(65) Prior Publication Data

US 2013/0003312 A1 Jan. 3, 2013

(30) Foreign Application Priority Data

Jun. 30, 2011 (IT) .............................. MI2011A1217

(51) Int. Cl.
| | | |
|---|---|---|
| H05K 7/20 | (2006.01) | |
| H01L 23/367 | (2006.01) | |
| H01L 23/40 | (2006.01) | |
| H01L 23/36 | (2006.01) | |

(52) U.S. Cl.
CPC ............ H01L 23/3672 (2013.01); H01L 23/40 (2013.01); *H01L 23/36* (2013.01); *H01L 23/3677* (2013.01); *H01L 2924/0002* (2013.01); *Y10T 29/4913* (2015.01)

(58) Field of Classification Search
CPC ............ H01L 2225/1094; H01L 33/64; H01L 33/23367; H05K 1/0203; H05K 2201/066
See application file for complete search history.

(56) References Cited

U.S. PATENT DOCUMENTS

| | | | |
|---|---|---|---|
| 3,548,927 A | * | 12/1970 | Spurling ...................... 165/80.3 |
| 3,670,215 A | * | 6/1972 | Wilkens et al. ............... 257/718 |
| 4,147,889 A | | 4/1979 | Andrews et al. |
| 4,254,447 A | * | 3/1981 | Griffis ........................... 361/719 |
| 4,611,238 A | | 9/1986 | Lewis et al. |
| 4,748,538 A | | 5/1988 | Tsuji |
| 4,849,856 A | * | 7/1989 | Funari et al. .................. 361/719 |
| 4,918,571 A | | 4/1990 | Grabbe |

(Continued)

FOREIGN PATENT DOCUMENTS

| | | |
|---|---|---|
| EP | 0812015 A1 | 12/1997 |
| EP | 0948047 A2 | 10/1999 |

(Continued)

OTHER PUBLICATIONS

Italian Search Report and Written Opinion for IT MI2011A001217 mailed Feb. 8, 2012 (9 pages).

*Primary Examiner* — Gregory Thompson
(74) *Attorney, Agent, or Firm* — Gardere Wynne Sewell LLP (57) ABSTRACT

An insulating body embeds an integrated circuit and has a mounting surface, an opposite free surface, and at least one pin exposed along an edge of the mounting surface and electrically connected to a terminal of the integrated circuit. A heatsink configured to dissipate heat produced by the integrated circuit is provided in correspondence of the free surface. The heatsink includes at least one protruding element including a connection portion partly extending in contact with the free surface and partly protruding beyond a boundary of the free surface (the connection portion having a free end being distal from the insulating body), and a mounting portion extending from the free end at least up to a plane of the mounting surface. The heatsink is further electrically connected to a terminal of the integrated circuit chip. The protruding element is placed in correspondence of the at least one pin.

16 Claims, 7 Drawing Sheets

(56) References Cited

U.S. PATENT DOCUMENTS

| | | | |
|---|---|---|---|
| 5,311,395 A * | 5/1994 | McGaha et al. | 361/720 |
| 5,504,652 A | 4/1996 | Foster et al. | |
| 5,546,275 A * | 8/1996 | Moutrie et al. | 361/707 |
| 5,977,630 A | 11/1999 | Woodworth et al. | |
| 6,054,759 A | 4/2000 | Nakamura | |
| 6,097,603 A * | 8/2000 | Edwards et al. | 361/719 |
| 6,150,254 A | 11/2000 | Kito | |
| 6,178,628 B1 * | 1/2001 | Clemens et al. | 29/840 |
| 6,707,676 B1 | 3/2004 | Geva et al. | |
| 6,833,997 B1 | 12/2004 | Jones, III et al. | |
| 7,145,224 B2 | 12/2006 | Kawashima et al. | |
| 7,286,361 B2 * | 10/2007 | Yamanaka | 361/704 |
| 7,746,650 B2 | 6/2010 | Hellinger et al. | |
| 7,776,658 B2 | 8/2010 | Liu et al. | |
| 7,816,784 B2 * | 10/2010 | Son et al. | 257/707 |
| 7,851,908 B2 | 12/2010 | Otremba et al. | |
| 7,892,893 B2 | 2/2011 | Obara | |
| 8,062,932 B2 | 11/2011 | Hebert et al. | |
| 8,154,108 B2 | 4/2012 | Liu et al. | |
| 8,358,017 B2 * | 1/2013 | Tsui | 257/778 |
| 8,390,041 B2 | 3/2013 | Yoshimochi | |
| 8,481,368 B2 | 7/2013 | Xue et al. | |
| 8,604,611 B2 | 12/2013 | Hauenstein | |
| 2004/0063246 A1 * | 4/2004 | Karnezos | 438/108 |
| 2005/0161785 A1 | 7/2005 | Kawashima et al. | |
| 2005/0280140 A1 | 12/2005 | Corbin et al. | |
| 2006/0091512 A1 | 5/2006 | Shinohara | |
| 2007/0090523 A1 | 4/2007 | Otremba | |
| 2007/0108564 A1 | 5/2007 | Tang et al. | |
| 2007/0215996 A1 | 9/2007 | Otremba | |
| 2008/0054422 A1 | 3/2008 | Koike et al. | |
| 2009/0057865 A1 | 3/2009 | Brodsky et al. | |
| 2009/0236732 A1 | 9/2009 | Yu et al. | |
| 2009/0323288 A1 | 12/2009 | Bernard | |
| 2010/0133674 A1 | 6/2010 | Hebert et al. | |
| 2011/0096509 A1 | 4/2011 | Yoshimochi | |
| 2013/0003305 A1 | 1/2013 | Stella | |
| 2013/0003308 A1 | 1/2013 | Stella | |
| 2013/0003311 A1 | 1/2013 | Privitera et al. | |
| 2013/0003312 A1 | 1/2013 | Stella et al. | |

FOREIGN PATENT DOCUMENTS

| | | |
|---|---|---|
| JP | 49047567 U | 4/1974 |
| JP | 58218149 A | 12/1983 |
| JP | 62104056 A | 5/1987 |
| JP | 4368155 A | 12/1992 |
| JP | 6037217 A | 2/1994 |
| JP | 8078584 A | 3/1996 |
| WO | WO-2006058030 A2 | 6/2006 |

* cited by examiner

PACKAGE/HEATSINK SYSTEM FOR ELECTRONIC DEVICE

PRIORITY CLAIM

This application claims priority from Italian Application for Patent No. MI2011A001217 filed Jun. 30, 2011, the disclosure of which is incorporated by reference.

TECHNICAL FIELD

The present invention refers to the field of electronics. In particular, the present invention to refers to packages for electronic components.

BACKGROUND

Any existing electronic component is characterized by electric power absorption—in general, proportional to the product of a current crossing it and a voltage that develops across its terminals—during an operation thereof. A portion of such absorbed electric power is lost as heat according to the principles of thermodynamics. In particular, heat is generated in "active" regions of the electronic component, i.e., where the flow of electric current occurs (for example, considering a MOSFET transistor, in a region below a control terminal and in regions forming the conduction terminals thereof). The heat generation concentrated in active regions causes a temperature rise of the electronic component. The temperature of the active regions of the electronic component, better known as junction temperature, is a parameter that strongly affects the operation of the electronic component. In particular, a threshold voltage of the electronic component, according to which the intensity of the current thereof is controlled, is inversely proportional to the junction temperature; consequently, for the same applied control voltage, the electronic component draws an electric current flow that increases with the rising of the temperature. It is also known that, with the rising of the junction temperature, there also occurs an increase in the electric resistivity of the electronic component. Consequently, the electronic component dissipates, due to the Joule effect, an increasing electric power between its terminals, and this leads to an ever rising junction temperature; in other words, it is established a positive feedback that may cause damage or even destruction of the electronic component due to a too high junction temperature. In addition, with the increasing of the junction temperature of the electronic component there is a reduction of the reliability thereof (i.e., the probability of occurrence of a structural damage during operation increases) and in general of its useful life (i.e., the time during which the electronic component works properly).

The ongoing miniaturization process of the electronic components (basically a reduction in the size of the electronic component, in particular of the active regions), makes it very important to limit the rise in the junction temperature within an acceptable range. Indeed, for the same absorbed electric power, the smaller the size of the active area of the electronic component the greater and the more rapid the rise in the junction temperature thereof (since the consumption of electric power is concentrated in a smaller volume). This is particularly important in electronic components belonging to the field of the "power electronics", i.e., electronic components designed to operate at high voltages and currents with respect to standard electronic components (for example, with operating voltages of the order of hundreds of Volts and/or with operating currents of the order of tens of Amperes), which are used in circuits of apparatuses belonging to various fields of application, for example, from personal computers to electromechanical equipments (computers power supply circuits, electric motor actuators, inverters for photovoltaic panels, etc.).

Heatsinks are known and widely used to limit the rise of the junction temperature in electronic components. A heatsink is an element consisting of one or more elements of thermally conductive material (e.g., aluminum Al), which is fixed (typically by gluing and/or double-sided adhesive material tapes) to a package of the electronic component. The package comprises a substantially insulating body (usually made of plastic or ceramic) and contact pins (for connecting the electronic component to tracks of an external circuit), and it is intended to embed and protect a chip of semiconductor material in which the electronic component is integrated.

Alternatively, the insulating body of the package may also comprise an opening—typically formed in an upper free surface of the insulating body opposite a mounting surface towards which the pins are orientated—to expose a dissipation plate (also made of thermally conductive material). The dissipation plate is connected to the chip for improving the heat exchange with the external environment. The heatsink may be attached directly to the dissipation plate by means of double sided adhesive tapes or glues with high thermal conductivity coefficient, which conform the contact surface, thus facilitating heat exchange between the plate and the heatsink (thanks to the greater thermal conductivity of the materials constituting the dissipation plate and the heatsink contacting each other with respect to the plastic ones constituting the insulating body).

In more detail, the heatsink facilitates the transfer of heat by conduction (thanks to its good thermal conductivity) from the chip to itself. In addition, the heatsink is usually formed with a structure designed to facilitate a transfer of heat by convection (for example, with a plurality of fins extending from a base through which the heatsink is fixed to the insulating body or to the dissipation plate) to the environment outside the package (i.e., transferring heat to the medium that surrounds the package, for example, air). In this way, suitably sized heatsinks allow for keeping the junction temperature below a safety temperature.

However, heatsinks suffer from a major disadvantage, particularly when applied to small packages (e.g., for embedding miniaturized electronic components). Indeed, the heatsinks tend to be mechanically unstable, once fixed to the package. This is due to the fact that by reducing the size of the packages, an available mounting surface is proportionally reduced. This reduced mounting surface may be insufficient to ensure good mechanical stability of the heatsink on the package; therefore, the heatsink might separate from the package as a result of mechanical stresses to which it may be subject. In addition, the weight of the heatsink and the mechanical stresses might cause a deterioration, or even a rupture, of contacts formed between one or more pins of the package and the corresponding conductive tracks of the board to which they are attached, up to causing their detachment and the malfunction of a circuit in which the electronic component is used.

SUMMARY

In general terms, the solution according to one or more embodiments is based on the idea of extending the heatsink comprised in the electronic device toward the mounting surface.

In particular, one or more aspects of the solution according to specific embodiments are set out in the independent claims, with advantageous features of the same solution that are set out in the dependent claims, whose wording is herein incorporated verbatim by reference (with any advantageous features provided with reference to a specific aspect of the solution according to an embodiment of the present invention which apply mutatis mutandis at any other aspect thereof).

More specifically, an aspect of a solution according to an embodiment provides a system comprising an insulating body embedding at least one chip in which at least one electronic component is integrated. The insulating body has a mounting surface, a free surface opposite the mounting surface, and at least one pin exposed in correspondence of an edge of the mounting surface. Each pin is electrically connect to a terminal of said at least one electronic component within the insulating body. The system further comprises a heatsink for dissipating heat produced by said at least one electronic component, which is provided in correspondence of the free surface of the insulating body. The heatsink includes at least one protruding element; said at least one protruding element has a connection portion partly extending in contact with the free surface and partly protruding beyond a boundary of the free surface (the connection portion having a free end being distal from the insulating body), and a mounting portion extending from the free end of the connection portion at least up to a plane of the mounting surface. In the solution according to an embodiment, the system further comprises means for electrically connecting the heatsink to the terminal of said at least one electronic component. The protruding element is placed in correspondence of said at least one pin.

Another aspect of a solution according to an embodiment provides a corresponding method for making such system.

A further aspect of a solution according to an embodiment provides an electronic device comprising the system.

Another further aspect of a solution according to an embodiment provides a complex apparatus comprising one or more of such electronic devices.

BRIEF DESCRIPTION OF THE DRAWINGS

A solution according to one or more embodiments, as well as additional features and its advantages will be better understood with reference to the following detailed description of an embodiment thereof, given purely by way of a non-restrictive indication and without limitation, to be read in conjunction with the attached figures (wherein corresponding elements are denoted with equal or similar references and their explanation is not repeated for the sake of brevity). In this respect, it is expressly understood that the figures are not necessarily drawn to scale (with some details that may be exaggerated and/or simplified) and that, unless otherwise specified, they are simply intended to conceptually illustrate the structures and procedures described herein. In particular.

DETAILED DESCRIPTION OF THE DRAWINGS

Figure 1A:
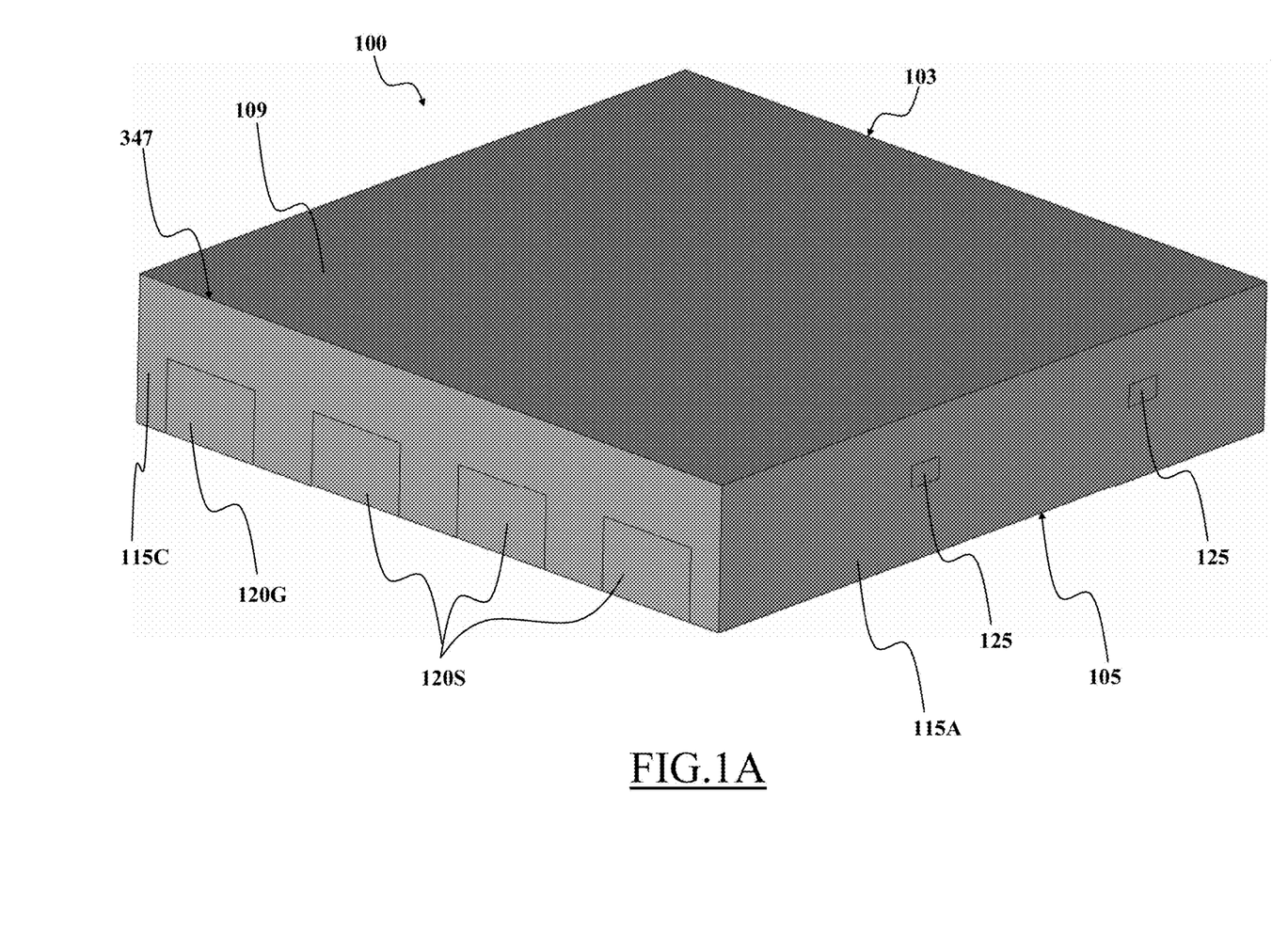
FIG. 1A illustrates a schematic axonometric view from the top of an electronic device to which the solution according to an embodiment may be applied.
Figure 1B:
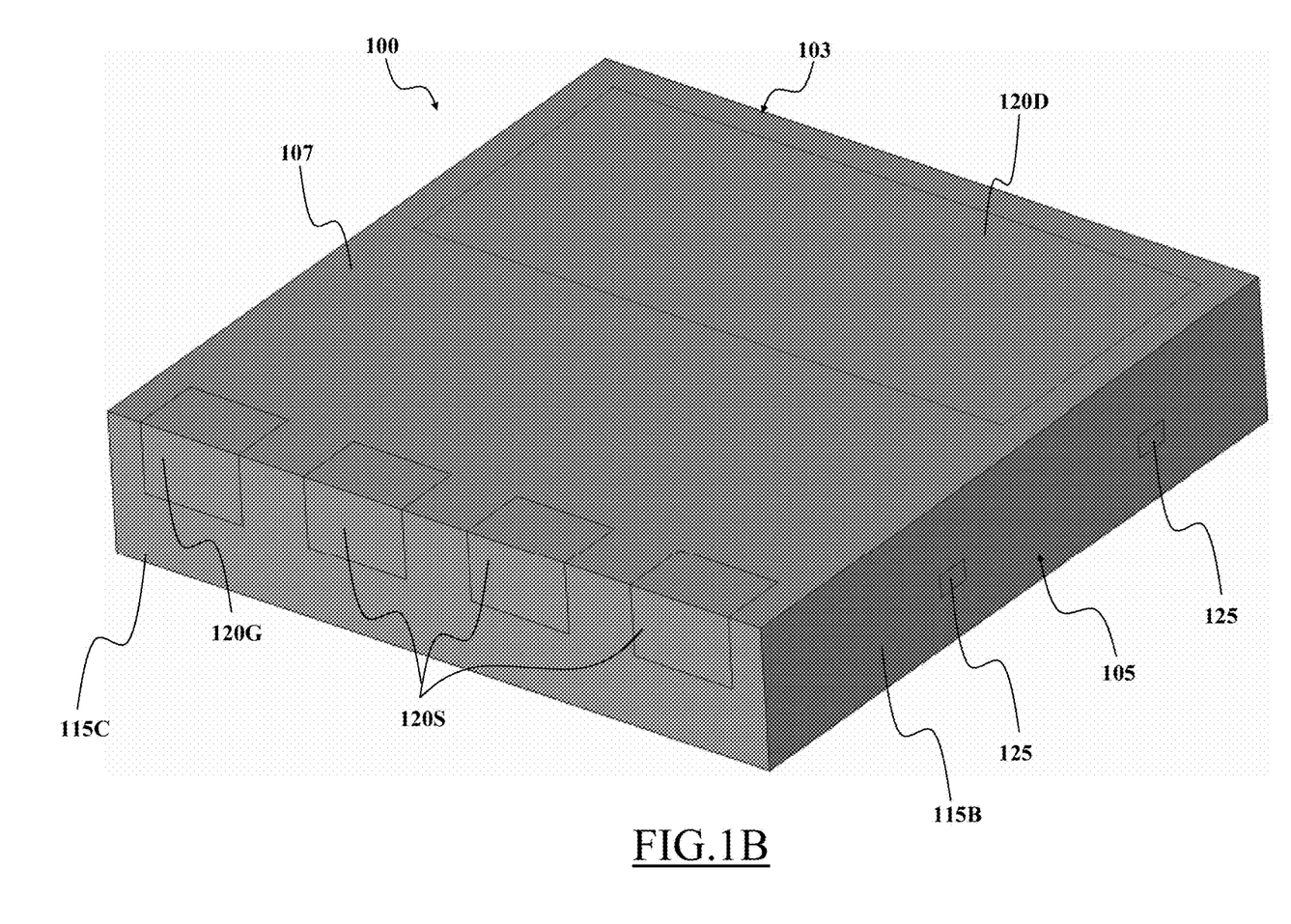
FIG. 1B illustrates a schematic axonometric view from the bottom of the same electronic device of FIG. 1.

With reference to FIG. 1A and FIG. 1B together, schematic axonometric views from the top and from the bottom, respectively, are illustrated of an electronic device 100 to which the solution according to an embodiment may be applied. In the example at issue, the electronic device 100 is of a Surface Mount Technology (SMT) type, i.e., it is adapted to be mounted onto a surface of a Printed Circuit Board (PCB) not shown in the figures.

The electronic device 100 comprises a package 103 formed by an insulating body 105 made of an insulating material (e.g., plastic or ceramic) having substantially rectangular shape with two main surfaces, i.e., a mounting surface 107 (for mounting on the board) and a free surface 109 opposite thereto. The mounting surface 107 and the free surface 109 are separated by side surfaces (of which only the side surfaces 115A, 115B and 115C visible in the figures).

The insulating body 105 is designed to protect and insulate from the outside one (or more) chip of semiconductor material, not visible in the figures, in which one (or more) electronic component is integrated—from a single element, for example, a transistor, to a complete electronic circuit, for example, a central processing unit. In order to obtain an electric path between the chip and elements external to the electronic device 100—thereby allowing connecting the electronic component to other electronic devices being not shown—on the insulating body 105 there are provided, for example, three pins 120S, a pin 120G and a pin 120D, each of which is formed by a contact pad in electric contact with corresponding conductive terminals of the chip (e.g., via connection wires, or "wire bonding" in the jargon, comprised within the insulating body 105, not shown in the figures). The pins 120S, 120G are generally square in shape, and extend partially on the mounting surface 107 and partially on a side surface 115C of the insulating body 105. Otherwise, the pin 120D is exposed on the mounting surface 107 and has a generally rectangular shape, and it covers about half of the mounting surface 107. For example, the pin 120D is connected to a drain terminal, the pins 120S are connected to a source terminal and the pin 120G is connected to a gate terminal of a power MOS transistor. In addition, the pin 120D acts as a heatsink for transferring the heat produced by the chip in operation to the board. The chip is mounted inside the insulating body 105 on a plate that defines the pin 120D. A plurality of tie-bars 125 (used to support such plate during the construction of the insulating body 105) protrude in pairs on each side surface of the insulating body 105, between the free surface 109 and the mounting surface 107 (with the tie bars 125 which are then electrically connected to the pin 120D).

Figure 2:
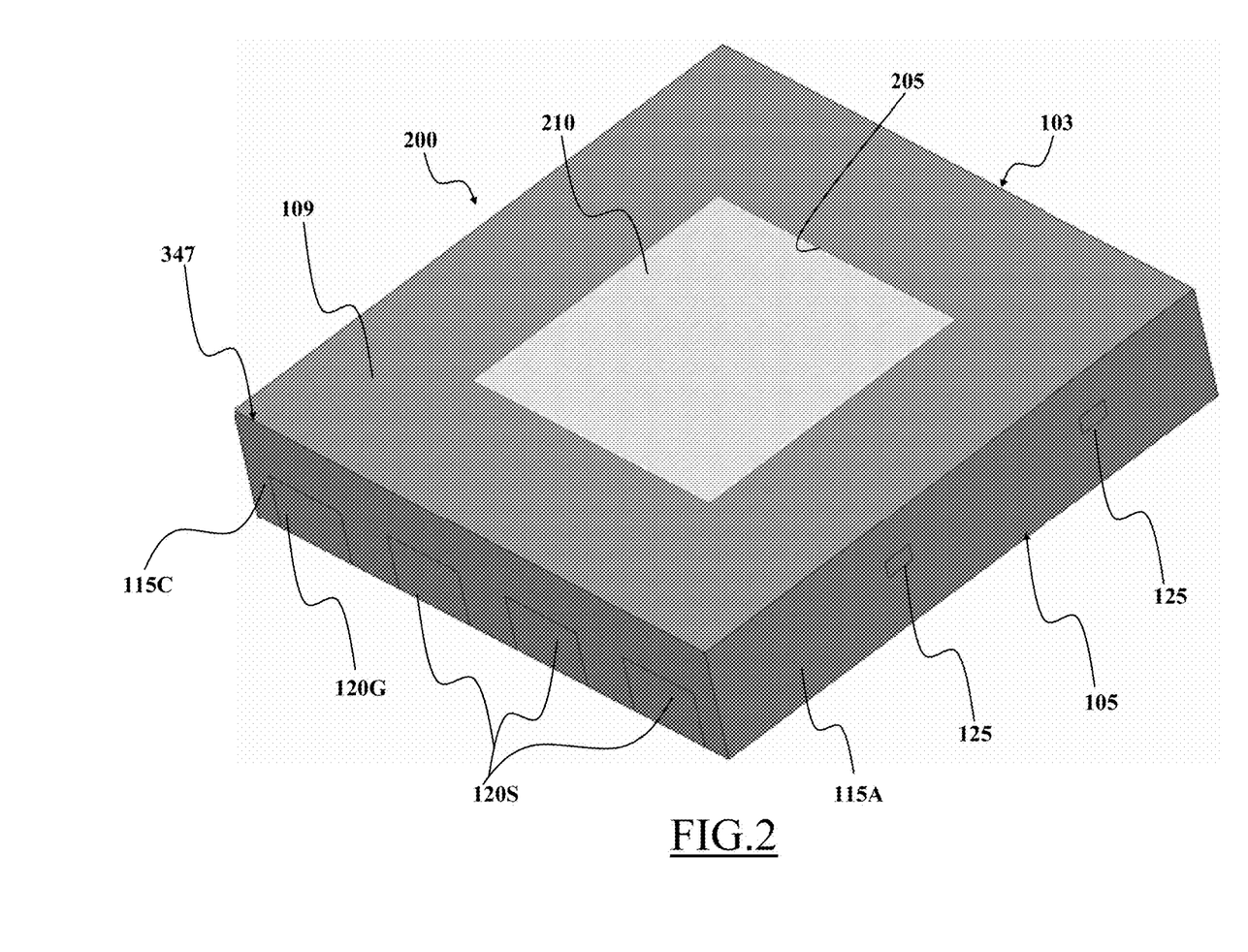
FIG. 2 illustrates a schematic axonometric view from the top of an alternative electronic device to which the solution according to an embodiment may be applied.

Turning now to FIG. 2, there is illustrated a schematic axonometric view from the top of an alternative electronic device 200 to which the solution according to an embodiment may be applied. The electronic device 200 differs from that of FIGS. 1A and 1B as follows. In this case, in correspondence of the free surface 109 of the insulating body 105 an opening 205 is formed through which a dissipation plate 210 is exposed. The dissipation plate 210 is in contact with the chip in order to transfer the heat generated by the latter into the external environment (i.e., it operates as an additional heatsink). The dissipation plate 210 is typically formed of a thermally and electrically conductive material (e.g., copper Cu). The dissipation plate 210 is typically connected to the source terminal of the electronic component (and therefore to the pins 120S as well).

Figure 3:
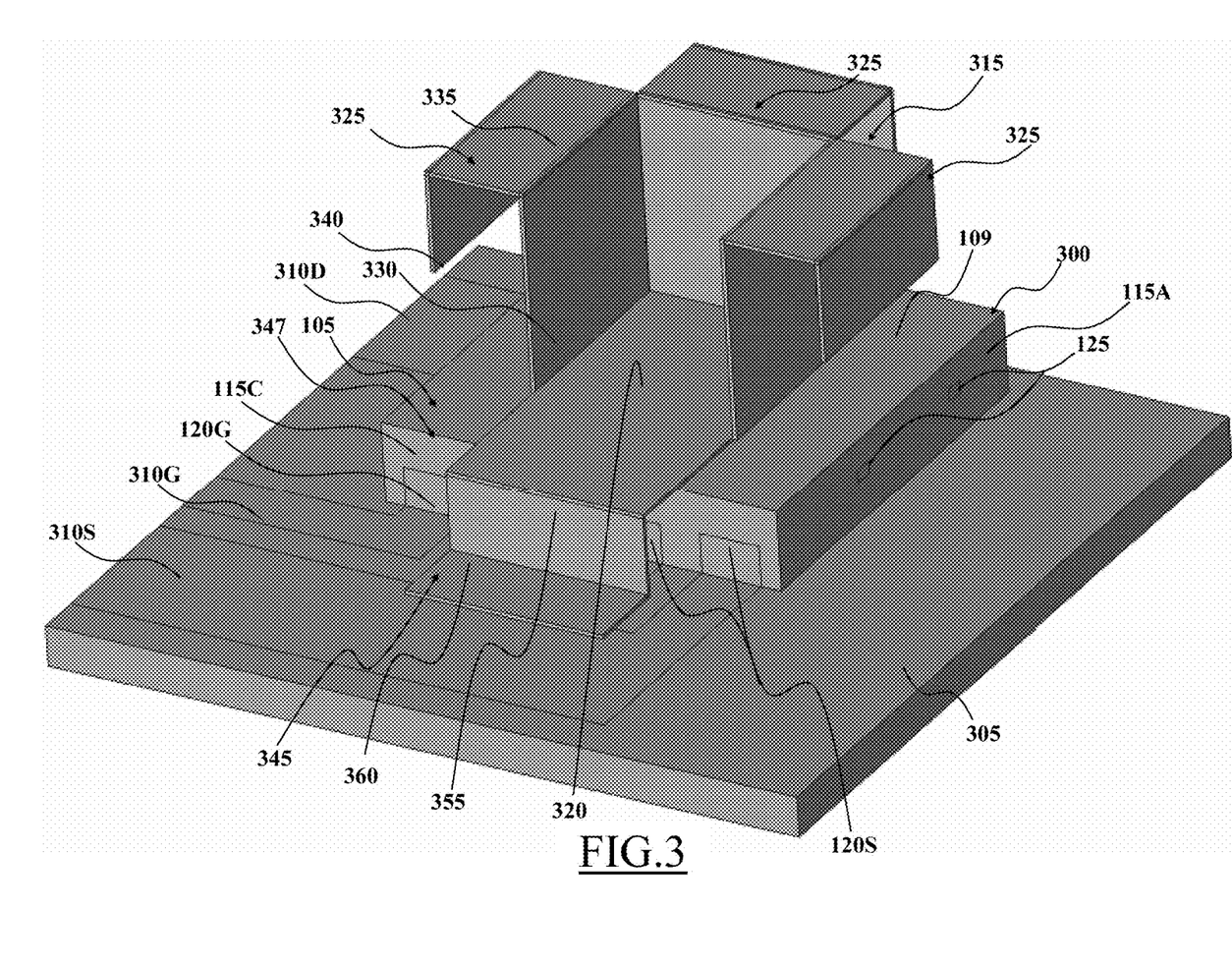
FIG. 3 illustrates a schematic axonometric view from the top of an electronic device according to an embodiment and of a portion of a board on which it is attached.
Figure 4:
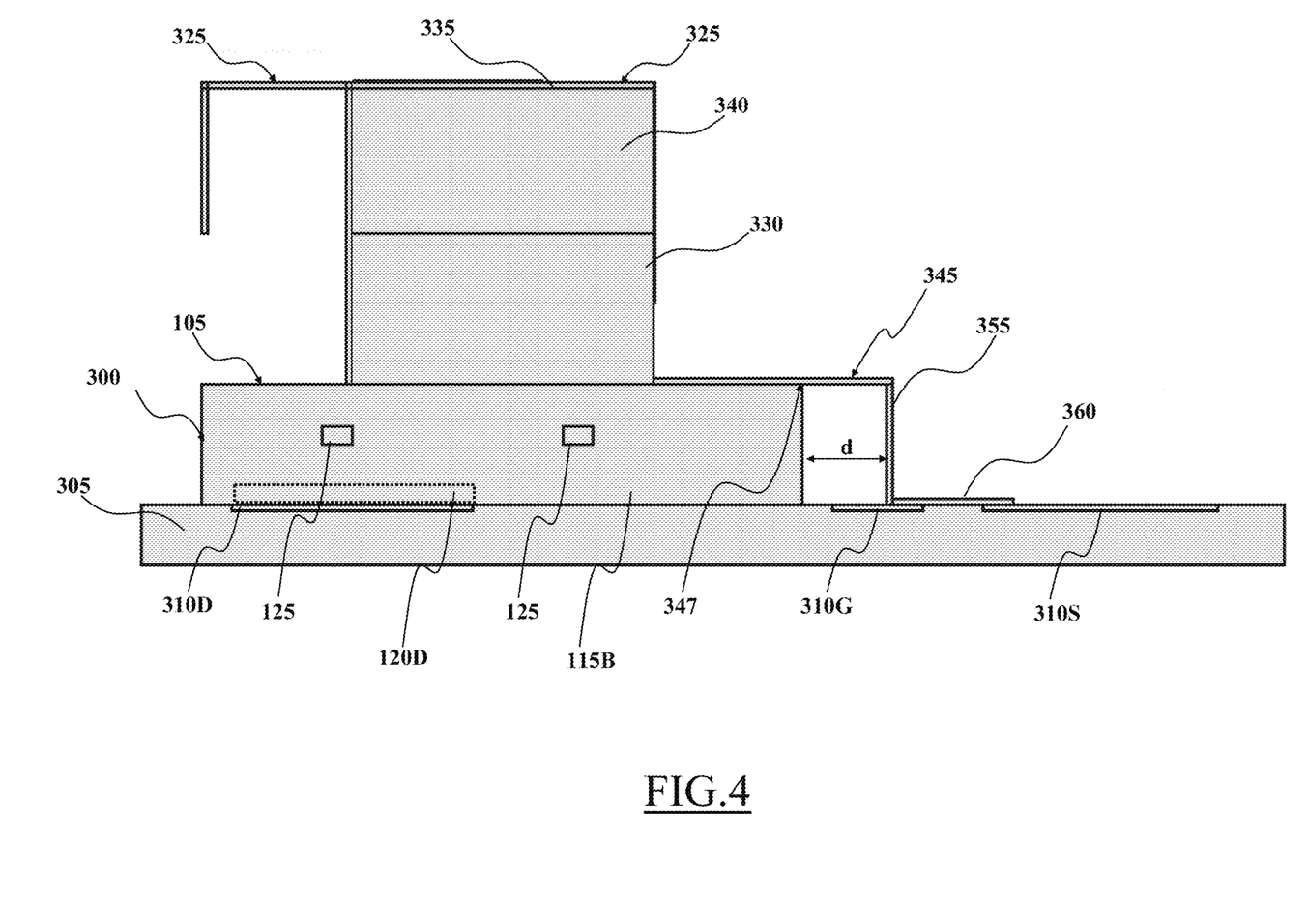
FIG. 4 illustrates a schematic side view of the electronic device, the heatsink and the portion of the board of the FIG. 3.

With reference to FIG. 3 and FIG. 4 together, a schematic axonometric view from the top and a schematic side view, respectively, of an electronic device 300 according to an embodiment are illustrated.

As usual, the electronic device 300 is attached to a circuit board 305 (e.g., a PCB), of which only a portion is shown in the figures.

In more detail, the pins 120G, 120S (and also the pin 120D, shown in dotted line only in FIG. 4) are attached temporarily to corresponding conductive tracks—i.e., a conductive track 310G for the pin 120G, a conductive track 310S for the pin 120S, and a conductive track 310D for the pin 120D—by means of a light pressure (pick and place), and they are then soldered through reflow thereon.

The electronic device 300 also comprises a (external) heatsink 315. A base portion (or simply base) 320 of the heatsink 315 is attached in correspondence of the free surface 109 of the insulating body 105 (essentially in the middle thereof). When the package 103 does not have any exposed dissipation plate at the free surface 109 (as shown in FIG. 1A-FIG. 1B), the base 320 is fixed to the insulating body 105 via a fastener (not shown in the figures), as a double-sided thermal tape, a thermal glue/paste or an epoxy resin. When the package 103 is instead provided of the dissipating plate (not shown in the figures) exposed on the free surface 109 (as shown in FIG. 2), the base 320 may be attached to such dissipation plate. In this case, unless an electrically insulating fastener (e.g., containing mica) is used, the heatsink 315 will be electrically connected to the source terminal of the MOS transistor through the dissipation plate (and therefore to the pin 120S as well). It should be noted that, generally, the heatsink 315 is not welded to the dissipation plate 210 (a weld, actually, might lead to an uneven mounting—for example, with air bubbles trapped in a filler material being used—thereby reducing the thermal conductivity between the heatsink 315 and the dissipation plate 210).

In the solution according to an embodiment, the heatsink 315 also comprises a protruding element (for example, a tab) 345 that extends from an edge of the base 320 beyond a boundary 347 of the insulating body 105. In more detail, the tab 345 comprises a connection portion, which is parallel to the free surface 109 and rests thereon up to the boundary 347 of the insulating body 105. The connection portion of the tab 345 which rests on the free surface 109 may be attached to the latter as the base 320. The connection portion of the tab 345 protrudes from the boundary 347, and it is connected to a mounting portion of the tab 345 (through its free end distal from the insulating body 105), which is bent to have an intermediate portion 355 transversal to the free surface 109 and extending towards (or beyond) the mounting surface 107. In the particular embodiment shown in the figure, the mounting portion of the tab 345 is also bent in correspondence of the board 305 in such a way to have a terminal portion 360 parallel thereto, then lying on the plane of the mounting surface 107, and thus of the board 305 as well. The terminal portion 360 is then attached to the board 305 (as described below).

The electronic device 300 is mechanically stable, once attached to the board 305. This is achieved thanks to the tab 345 that provides good mechanical stability of the heatsink 315 mounted on the insulating body 105 once the terminal portion 360 is attached to the board 305; as a result, the electronic device is able to withstand mechanical stresses to which it may be subject. In addition, the weight of the heatsink 315 is discharged at least in part directly onto the board 305 through the tab 345. In this way the possibility of a deterioration, or even a rupture, of contacts formed between one or more of the pins 120S, 120G and 120D and the corresponding tracks 310S, 310G and 310D to which they are attached due to the weight of the heatsink 315 and/or to the mechanical stress is nullified, or at least reduced. Thus an electronic device 300 more reliable and at the same time adapted to effectively dissipate the heat generated by the operation of the electronic component contained in the insulating body 105 is obtained. At the same time, the protruding portion 345 as well contributes to the heat dissipation by transferring heat both to the external environment by convection and to the tab 305 by conduction.

In a specific embodiment, when the heatsink 315 is electrically connected to the source terminal of the MOS transistor, the terminal portion 360 of the tab 345 may extend at least partially above the corresponding track 310S (to which the pin 120S is attached), and then it may be attached thereto. In this way, there is provided a further conductive path that enhances the connection to the source terminal of the MOS transistor. Preferably, the terminal portion 360 is attached to the track 310S in the same way in which the base 320 is fixed to the free surface 109 (in this case as well, so as to avoid formation of air bubbles that may reduce the thermal conductivity between the terminal portion 360 and the track 310S).

In particular, the protruding portion 345 may protrude from the boundary 347 for a distance d sufficient to allow a simple inspection of the contact between the pin 310S and the track 120S (for example, 1-5 mm).

Near the other three boundaries of the base 320 (where the tab 345 is not present), corresponding fins 325 extend substantially transversal to the free surface 109 of the insulating body 105 (away from it, upwards in the figures). Each fin 325 comprises, in succession from the base 320, a proximal portion 330, a distal portion 335 and a terminal portion 340. In more detail, the proximal portion 330 extends transversal to the free surface 109 of the insulating body 105 from the base 320, the distal portion 335 is bent outwards so as to be parallel to the free surface 109 of the insulating body 105, and the terminal portion 340 is bent in such a way to be parallel to the proximal portion 330 (then transversal to the free surface 109) and to extend towards the free surface 109 (i.e., downwards in the figures).

The distal portion 335 and the terminal portion 340 concentrate the heat transfer by convention into a location far away from the electronic device 300 in such a way to facilitate the cooling of the chip of the electronic component during operation.

In addition, the heatsink 315 is biased to the voltage of the source pin 120S. The heatsink 315 is designed and placed on the insulating body 105 so as to ensure compliance with appropriate safety distances between portions of the heatsink 315 and the pins 120G and 120D, and between the portions of the heatsink 315 and the tie bars 125, to prevent the occurrence of arc discharges, or corona phenomena, since such elements are biased to different potential levels during the operation of the electronic device 300. Such safety distances comprise the so-called surface distance or "creepage" and the so-called air distance or "clearance". In particular, the surface distance is defined as the minimum distance between two elements of the electronic device—each biased to a different level of electric potential—measured along surfaces of the electronic device, such that between this pair of elements no electric arc discharge originates. Furthermore, the air distance is defined as the minimum distance between two elements of the electronic device—each biased to a different level of electric potential—measured as direct distance, such that between this pair of elements no electric arc discharge originates. Both the surface distance and the air distance are proportional to the difference between the voltages of the biased elements (for example, with a factor of proportionality between 1 mm/KV and 10 mm/KV); thus, such distances are greater in the case of power electronic devices (due to the high potential differences between terminals of the electronic component).

In detail, the heatsink 315 should be positioned so that each of its parts (i.e., the base 320, the fins 325 and the tab 345) is at least at a first surface distance x (of the order of millimeters) from the pin 120G and at least at a second surface distance y from the tie bars 125—again of the order of millimeters and greater than the first surface distance x since the tie bars 125 are biased to the voltage of the pin 120D, higher than the voltage of the pin 120G—to prevent the occurrence of surface electric discharges along the surfaces of the insulating body 105 and/or the board 305. In addition, the heatsink 315 should comply with a first air distance u (of the order of millimeters) from the gate pin 120G, and a second air distance t from the tie bars 125—of the order of millimeters, as in the previous case greater than the first air distance u because of the increased voltage to which the tie bars 125 are biased with respect to gate pin 120G—to prevent the occurrence of electric arc discharges between the pin 120G or the tie bars 125 and the heatsink 315 through the medium by which the electronic device 300 is surrounded (e.g., air).

It is emphasized that the solution described above may also be applied to a package/heatsink system adapted to be put on the market without the chip, which may then be placed inside the package later on by the buyer.

Figure 5:
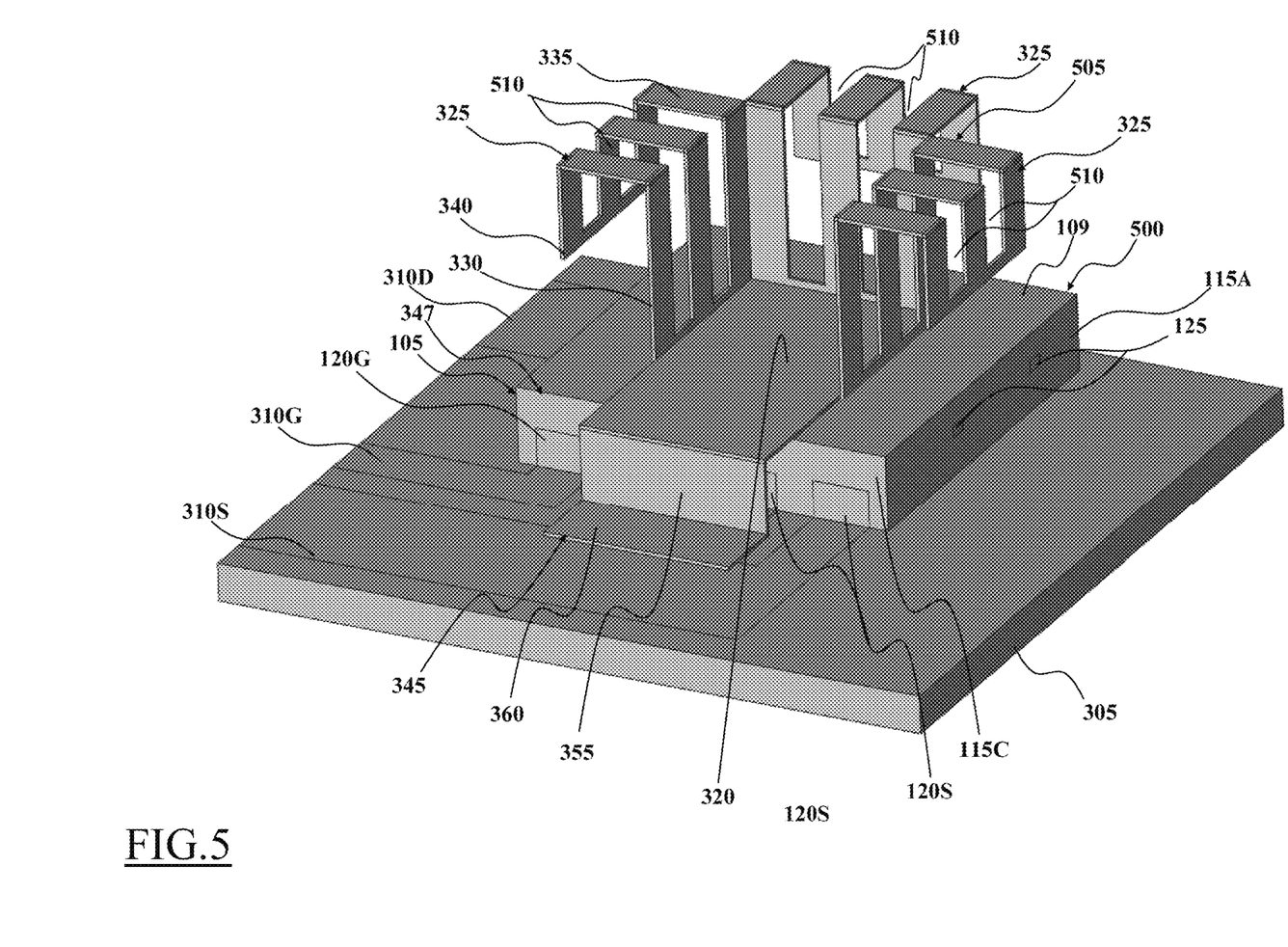
FIG. 5 illustrates a schematic axonometric view from the top of an electronic device according to a further embodiment and of a portion of a board on which it is attached.

Turning now to FIG. 5, there is illustrated schematically in axonometric view from the top an electronic device 500 according to a further embodiment and a portion of a board on which it is attached. The electronic device 500 differs from the one previously described as follows. The electronic device 500 comprises a heatsink 505 similar to the previous case, but where in each of the fins 325 one or more openings or apertures 510 are provided (two in this example). The openings 510 extend longitudinally along the fins 325; moreover, the openings 510 are preferably, but without limitation, formed, equidistant from each other and with a substantially rectangular shape.

This configuration of the heatsink 505 is advantageous when a greater heat transfer through convection of heat rather than through conduction is required (for example, in implementations in which the electronic component operates for long periods of time, for example, of the order of hours or days). Indeed, the openings 510 allow a greater circulation of air among the fins 325 of the heatsink 505 with respect to the solid heatsink 315 of FIGS. 3 and 4. Furthermore, as it is known, the convective heat transfer is proportional to the perimeter of the heatsink 505 which is substantially increased by the presence of the openings 510.

Figure 6:
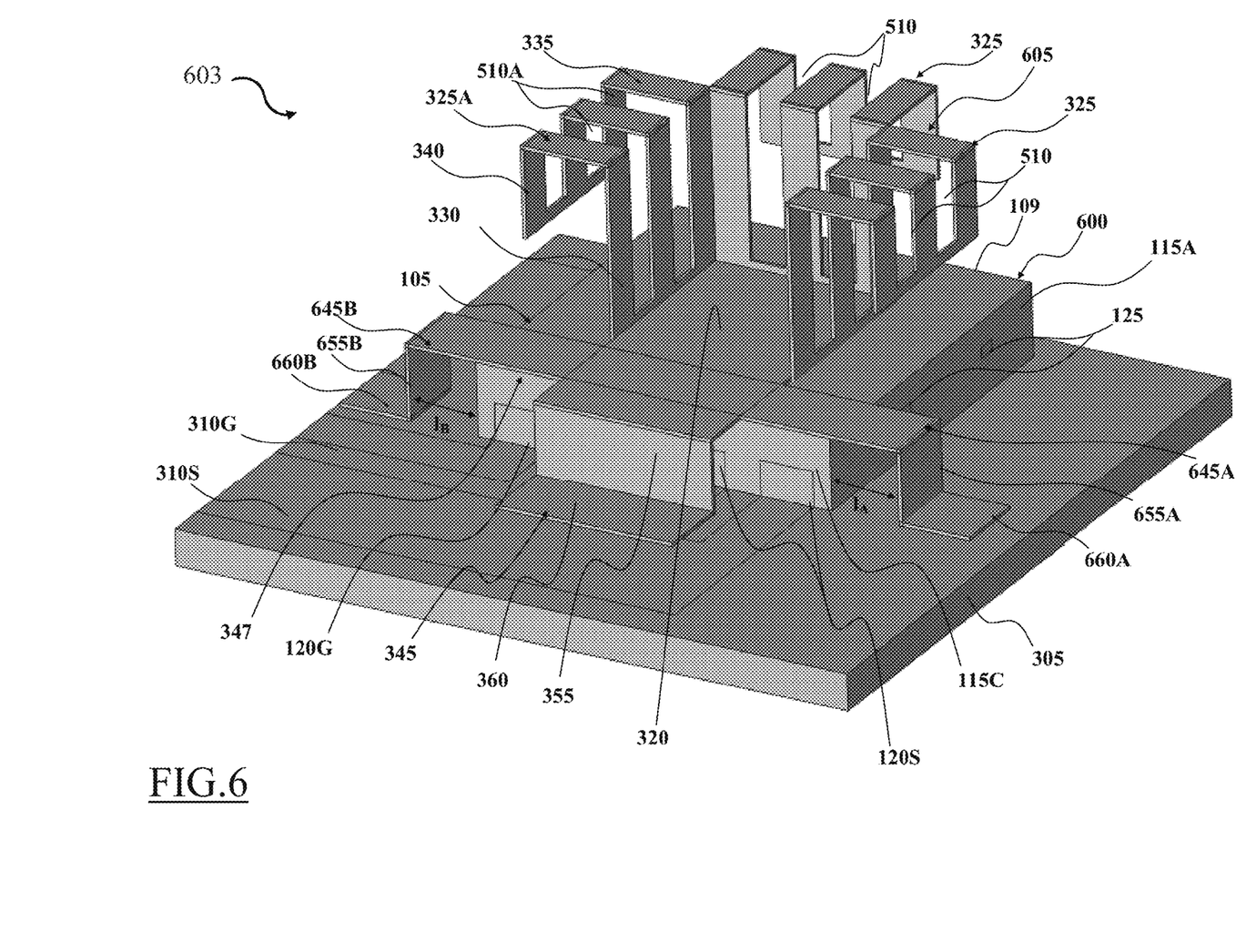
FIG. 6 illustrates a schematic axonometric view from the top of an electronic device with a package according to a still further embodiment and of a portion of a board on which it is attached.

Considering FIG. 6, there is illustrated an axonometric view of an electronic device 600 according to a still further embodiment. The electronic device 600 differs from those previously described as follows.

The electronic device 600 comprises a heatsink 605 similar to the previous case (shown with the openings 510 in the figure, but also suitable to be made with the solid structure). In this case, two protruding portions (for example, again two tabs) 645A and 645B are provided. The tabs 645A and 645B are formed substantially transversal to the tab 345 and they extend in directions opposite to each other (towards the side surfaces 115A and 115B, respectively). As above, the tabs 645A and 645B comprise a connection portion parallel to the free surface 109 and resting on it up to the boundary 347 of the insulating body 105. The connection portion of the tabs 645A and 645B which rests on the free surface 109 may be attached to the latter as in the previous case. Each tab 645A, 645B comprises a mounting portion (as in the previous case tied to an end of the connection portion) bent in order to have an intermediate portion 655A, 655B transversal to the free surface 109 and extending towards the board 305. The mounting portion of the tab 645A, 645B is also bent parallel to the board 305 in order to provide a terminal portion 660A, 660B, which lies on the same plane of the terminal portion 360 and of the pins 120G, 120S, and 120D. The terminal portions 660A and 660B may be attached to the board 305 (onto appropriate pads provided for this purpose, not shown in the figure, or onto non-conductive parts of the board 305) as previously described with respect to the base 320. It should be noted that, in this case, the tabs 645A and 645B extend for distances $L_A$ and $L_B$, respectively, from the boundary 347 of the insulating body 105, so as to ensure a distance between them and the gate pin 120G, and between them and the tie bars 125, greater than or equal to the first surface distance x and the second surface distance y, respectively, and at the same time greater than or equal to the first air distance u and the second air distance t, respectively, in order to avoid the above-mentioned hazards of arc discharge.

This heatsink 605 allows obtaining greater stability and mechanical strength of the attachment of the heatsink 605 itself and of the package 603 as a whole. This is possible thanks to the two tabs 645A and 645B which provide two additional attaching points to the board 305 with respect to the heatsinks described above.

In general, all the heatsinks described above may be formed through a process of molding of a sheet of thermally conductive material (e.g., an aluminum foil), followed by a bending phase of the molded sheet. Consequently, such heatsinks may be manufactured in large volumes at low cost and with relatively simple manufacturing equipments.

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice.

For example, similar considerations apply if the electronic device has a different structure or comprises equivalent components, or it has other operating characteristics. In any case, any component thereof may be separated into several components, or two or more components may be combined into a single element; in addition, each component may be replicated to support the implementation of the corresponding operations in parallel. It should also be noted that (unless stated otherwise) any interaction between different components usually need not be continuous, and it may be both direct and indirect through one or more intermediaries.

In particular, the solution is not limited to SMT but it is applicable to other mounting technologies, for example, the Through-Hole Technology or THT.

Furthermore, it is possible to form the insulating body with different shapes, and to replace the tab with any other protruding element. Moreover, the protruding element may be attached directly onto the free surface and/or the dissipating plate embedded in the insulating body (without any mounting base).

The terminal portion of the tab might be formed so as to be substantially transversal to the mounting surface and to be attached to the latter through an end thereof, or pass through it partially or completely.

Nothing prevents directing the protruding portion towards a further side surface of the insulating body, but maintaining the surface and air distances required for a safe operation.

In addition, the tab may be bent so that its intermediate portion contacts a side surface of the insulating body.

The heatsink may also be formed with any number of fins, down to be free of them. Alternatively, fins may be provided on the base portion of the heatsink or items with a different form, for example, frustoconical-shaped, may be provided to increase heat dissipation by convection.

Nothing prevents forming the fins with different bends (e.g., with the terminal portion formed in such a way to extend in the opposite direction with respect to the free surface); moreover, the bends may be absent (with fins simply transversal to the free surface), or in different number (for example, a single bend, or more than two bends).

The heatsinks may be formed through other processes, for example, by extrusion.

Similar considerations apply if the same solution is implemented by an equivalent method (using similar steps with the same functions of more steps or portions thereof, removing some steps being not essential, or adding further optional steps); moreover, the steps may be performed in different order, in parallel or overlapping (at least in part).

In addition, the electronic device may be used in any complex electronic device (for example, in mobile phones).

What is claimed is:

1. A system, comprising:
   an insulating body configured to embed at least one chip in which at least one electronic component is integrated, the insulating body having a mounting surface configured to be mounted to a board and a free surface opposite the mounting surface and a peripheral side surface between the mounting and free surfaces,
   a first pin surface exposed from the mounting surface of the insulating body and coplanar with said mounting surface;
   a second pin surface exposed from the mounting and peripheral side surfaces of the insulating body and coplanar with both the mounting and peripheral side surfaces,
   wherein the first and second pins are each electrically connected to terminals of said at least one electronic component within the insulating body, and
   a heatsink configured to dissipate the heat produced by said at least one electronic component, the heatsink attached to the free surface of the insulating body,
   wherein the heatsink comprises at least one protruding element, said at least one protruding element having:
   a connection portion partly extending over the free surface and partly protruding beyond the peripheral side surface, the connection portion having an end being distal from the insulating body, and
   a mounting portion extending from the end of the connection portion at least to a plane of the mounting surface; and
   wherein the heatsink is electrically connected to a terminal of said at least one electronic component within the insulating body, the mounting portion of the protruding element being placed in correspondence of, but offset by a non-zero distance from, said second pin surface and said peripheral side surface.

2. The system according to claim 1, wherein the heatsink is at least at a creepage distance from said first pin surface.

3. The system according to claim 2, further comprising a third pin surface exposed from the insulating body and coplanar with both the mounting and peripheral side surfaces and said heatsink is at least at the creepage distance from said third pin surface.

4. The system according to claim 2, further comprising at least one tie-bar extending from a conductive plate wherein said at least one chip is mounted, each tie-bar being exposed from the insulating body on the peripheral side surface and said heatsink is at least at the creepage distance from said exposed tie-bar.

5. The system according to claim 4, wherein at least part of the conductive plate is exposed from the insulating body on the mounting surface to define a further heatsink.

6. The system according to claim 1, wherein the heatsink comprises an attaching base attached on the free surface, the protruding element extending from the attaching base.

7. The system according to claim 6, wherein the attaching base is attached to a dissipation plate embedded in the insulating body and exposed on the free surface.

8. The system according to claim 1, wherein the mounting portion is defined by an intermediate portion bent for reaching the mounting plane and a terminal portion bent to lie on the mounting plane.

9. The system according to claim 6, wherein the heatsink further comprises at least one fin extending from the attaching base transversally with respect to the free surface away from the insulating body.

10. The system according to claim 9, wherein each fin includes at least one aeration opening structure.

11. The system according to claim 9, wherein each fin comprises a distal portion from the free surface being bent substantially parallel to the free surface.

12. The system according to claim 11, wherein each fin further comprises a terminal portion being bent towards the free surface from the distal portion.

13. A system, comprising:
    an insulating body configured to embed an integrated electronic component having a source terminal, a drain terminal and a gate terminal, the insulating body having a mounting surface, a free surface opposite the mounting surface and a peripheral side surface between the mounting and free surfaces,
    a drain pin surface exposed from and coplanar with the mounting surface of the insulating body, said drain pin surface electrically connected to the drain terminal;
    a source pin surface exposed from and coplanar with the mounting surface and a first edge of the peripheral side surface of the insulating body, said source pin surface electrically connected to the source terminal;
    a gate pin surface exposed from and coplanar with the mounting surface and the first edge of the peripheral side surface of the insulating body, said gate pin surface electrically connected to the gate terminal; and a heatsink configured to dissipate the heat produced by said integrated electronic component, the heatsink comprising:
   a base portion attached to the free surface of the insulating body, and
   a protruding element having:
      a connection portion extending from the base portion and protruding beyond the peripheral side surface at said first edge, the connection portion having an end being distal from the insulating body, and
      a mounting portion extending from the end of the connection portion at least to a plane of the mounting surface, said mounting portion being offset by a non-zero distance from said peripheral side surface at said first edge and furthermore placed in correspondence of at least one of the source and gate pin surfaces at said peripheral side surface.

14. The system according to claim 13, wherein the heatsink is at least at a creepage distance from said drain pin surface.

15. The system according to claim 13, wherein the heatsink is at least at a creepage distance from said gate pin surface.

16. The system according to claim 13, wherein the heatsink is electrically connected to the source pin surface.

\* \* \* \* \*